(12) United States Patent
Yakura

(10) Patent No.: US 6,348,808 B1
(45) Date of Patent: Feb. 19, 2002

(54) MOBILE IONIC CONTAMINATION DETECTION IN MANUFACTURE OF SEMICONDUCTOR DEVICES

(75) Inventor: James Yakura, Colorado Springs, CO (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/344,056

(22) Filed: Jun. 25, 1999

(51) Int. Cl.$^7$ ................................................ G01R 31/26
(52) U.S. Cl. ........................................ 324/765; 324/763
(58) Field of Search ................................. 324/768, 765, 324/769, 763; 438/14–18; 257/40, 48

(56) References Cited

U.S. PATENT DOCUMENTS

| | | |
|---|---|---|
| 4,978,915 A | 12/1990 | Andrews, Jr. et al. |
| 5,103,183 A | 4/1992 | Klein et al. |
| 5,298,784 A | 3/1994 | Gambino et al. |
| 5,486,772 A * | 1/1996 | Hshieh et al. ............... 324/769 |
| 5,585,736 A | 12/1996 | Hshieh et al. |
| 5,619,459 A | 4/1997 | Gilliam |
| 5,627,479 A | 5/1997 | Viscor et al. |
| 6,005,409 A * | 12/1999 | Bui et al. .................... 324/769 |

OTHER PUBLICATIONS

"Mobile Ion Monitoring by Simultaneous Triangular Voltage Sweep," Semiconductor Keithley Products, Lee Stauffer, Tom Wiley, Tom Tiwald, Robert Hance, P. Rai–Choudhury, D.K. Schroder, http://www.keithley.com/TIG/SBU/articles/mobileion, Jun. 9, 1998 8:24 am, pp 1–8.

"Technical Report on Bake Recoverable Fails," Technical Report on Bake Recoverable Fails, http://design–net.com/csic/techhelp/quality/bake.html, Jun. 9, 1998 8:16am, pp 1–5.

* cited by examiner

*Primary Examiner*—Vinh P. Nguyen
(74) *Attorney, Agent, or Firm*—The Law Firm of Luedeka, Neely & Graham

(57) ABSTRACT

A test transistor structure formed in a semiconductor device has a thick-oxide transistor with an elongated serpentine-shaped metal gate. The gate is used to first measure the threshold voltage of the thick-oxide test structure. Then, a current is passed through the elongated metal line which forms the serpentine gate to heat the area of the test structure. While being heated, a stress voltage is applied between the substrate and one end of the gate electrode, this stress voltage being much larger than the logic voltage used in operating thin-oxide transistors on the chip. After a selected time, the current is removed, the stress voltage is removed, and the threshold voltage of the thick-oxide transistor is again measured and compared to the original value. Any reduction in threshold voltage can be attributed to the migration of positive charge to the silicon-to-oxide interface beneath the gate, and is proportional to the area between the source and drain regions of the test transistor.

4 Claims, 3 Drawing Sheets

MOBILE IONIC CONTAMINATION DETECTION IN MANUFACTURE OF SEMICONDUCTOR DEVICES

BACKGROUND OF THE INVENTION

1. Technical Field

This invention relates to semiconductor devices, and more particularly to test structures formed in a surface of a semiconductor device for detecting mobile ionic contamination at a silicon-to-oxide interface, during manufacture.

2. Description of the Related Art

In the manufacture of semiconductor devices, test structures are added to the circuitry on a chip or wafer to facilitate making various tests. One of the qualities for which test data is needed is that of the degree of contamination by mobile ions at a silicon-to-oxide interface. Particularly, ionic contamination is an issue in MOS field-effect transistors where the junction between the gate oxide and the underlying silicon channel region is susceptible to this problem. Whenever an electric field is maintained across a silicon oxide layer for long periods of time, ions of contaminant materials will migrate toward an interface. The time for this contamination to build up to a point where the threshold voltage is noticeably affected is lengthy, however, so a life test cannot be performed in any efficient manner at the time of manufacture. Accordingly, various test structures and methods are used to speed up the ionic migration so that a valid test can be made in a reasonable time. The ionic migration is dependent upon voltage level, i.e., the electric field applied across the gate oxide, and is also dependent upon temperature. So, test structures and methods have relied upon applying higher-than-normal voltages to the devices, and on heating them to above normal operating temperatures. In this manner, tests may be made in much shorter times.

Previous methods and test structures have relied upon a slotted polysilicon heater to allow the mobile ionic contaminants to move more rapidly in the presence of an applied bias. The test structure is essentially a transistor, the source and drain regions being N-well diffusions and the gate electrode being a metal plate. The gate dielectric in that case was the full thickness of the dielectric below the metal plate down to the silicon substrate. Because of the polysilicon heater, the effective width of the transistor is the width of the slot in the poly heater, and the transistor width is the distance between the N-well regions. In order to maintain the temperature in the region through which the mobile ions must pass, the slot in the polysilicon heater must be restricted to a fairly narrow width. This narrow width restricts the sensitivity of the test structure.

It is therefore preferable to eliminate the polysilicon heater in a test structure for mobile ion contamination, so that greater sensitivity can be obtained.

SUMMARY OF THE INVENTION

It is therefore one object of the present invention to provide an improved method of testing semiconductor devices.

It is another object of the present invention to provide an improved method of manufacturing MOS devices in which detection of mobile ionic contamination is more efficient.

It is yet another object of the present invention to provide a method of detecting mobile ionic contamination in MOS devices which is more sensitive than previous methods.

The above as well as additional objects, features, and advantages of the present invention will become apparent in the following detailed written description.

According to one embodiment of the invention, a test transistor structure formed in a semiconductor device has a thick-oxide transistor with an elongated serpentine-shaped metal gate. The gate is used to first measure the threshold voltage of the thick-oxide test structure. Then, a current is passed through the elongated metal line which forms the serpentine gate to heat the area of the test structure. While being heated, a stress voltage is applied between the substrate and one end of the gate electrode, this stress voltage being much larger than the logic voltage used in operating thin-oxide transistors on the chip. After a selected time, the current is removed, the stress voltage is removed, and the threshold voltage of the thick-oxide transistor is again measured and compared to the original value. Any reduction in threshold voltage can be attributed to the migration of positive charge to the silicon-to-oxide interface beneath the gate, and is proportional to the area between the source and drain regions of the test transistor. The improved test structure is thus a thick-oxide transistor with N+ source and drain regions and a serpentine-shaped metal gate. The high temperature for the stress is supplied by Joule heating in the serpentine metal line which is between the source and drain regions. The line is long enough to permit accurate resistance measurements that are used for temperature determination. Because of the thermal gradient between the Joule-heated metal line and the substrate, there is an additional directional drive on the mobile ions. In this structure, nearly the entire length of the metal line can be used to detect mobile ionic contaminants.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment, when read in conjunction with the accompanying drawings, wherein:

DETAILED DESCRIPTION OF PREFERRED EMBODIMENT

Figure 1:
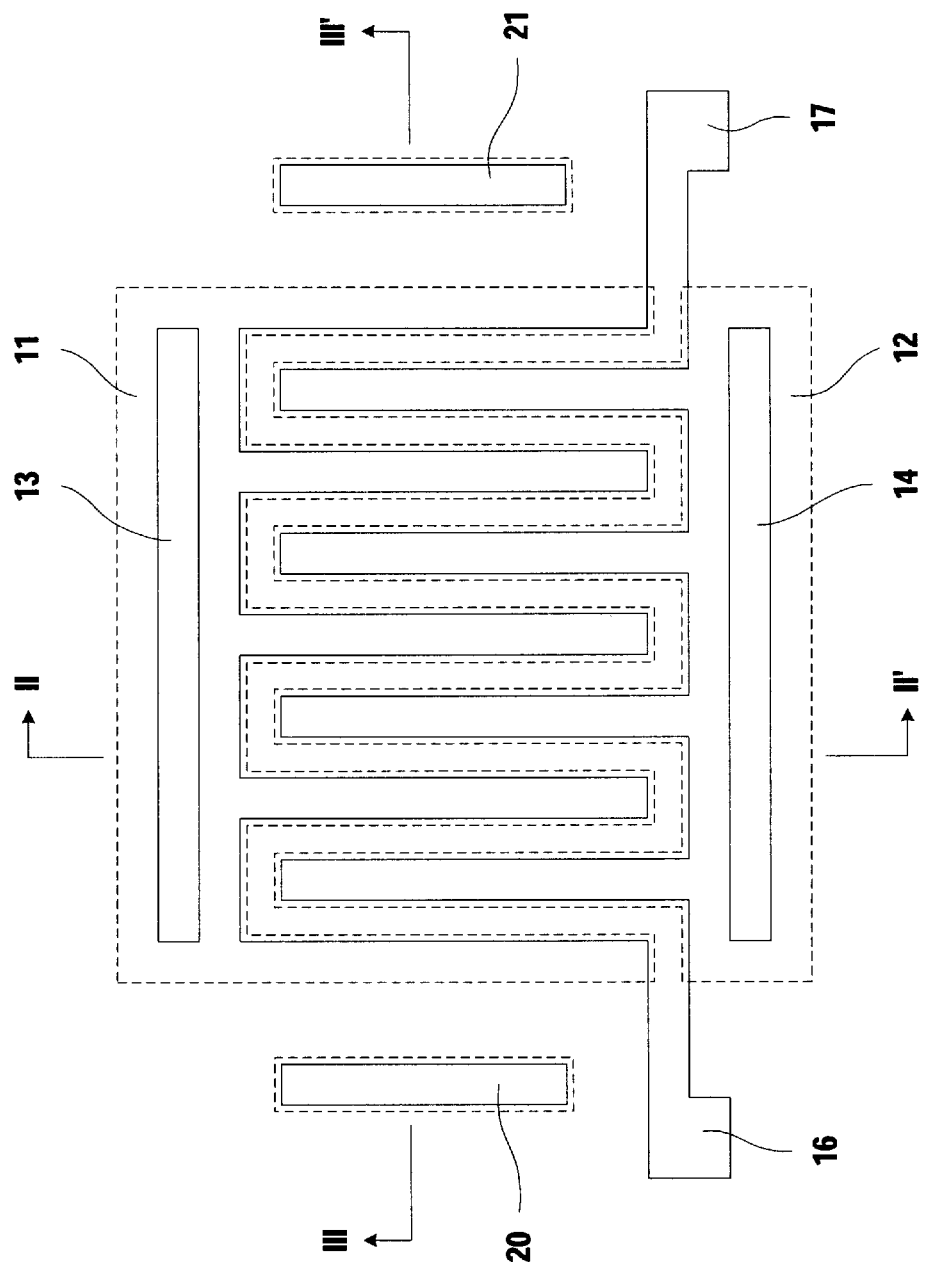
FIG. 1 is a plan view of a part of a semiconductor device typical of the type which may use the features of one embodiment of the present invention, greatly enlarged to show the test structure of the invention.
Figure 2:
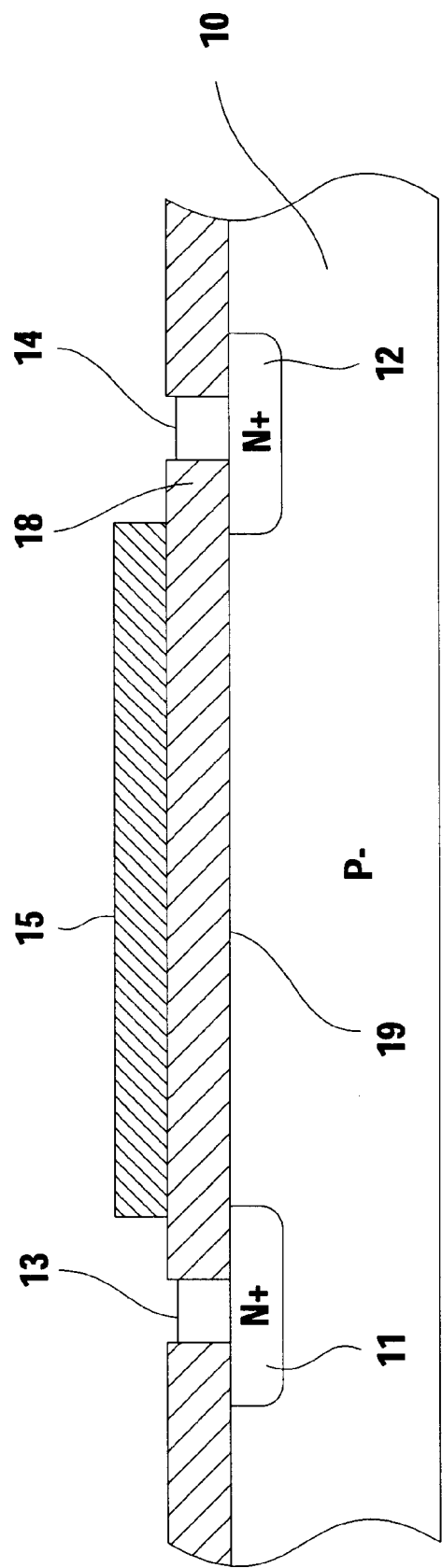
FIG. 2 is an elevation view in section of the semiconductor device of FIG. 1, the section being taken along the line 2—2 in FIG. 1.
Figure 3:
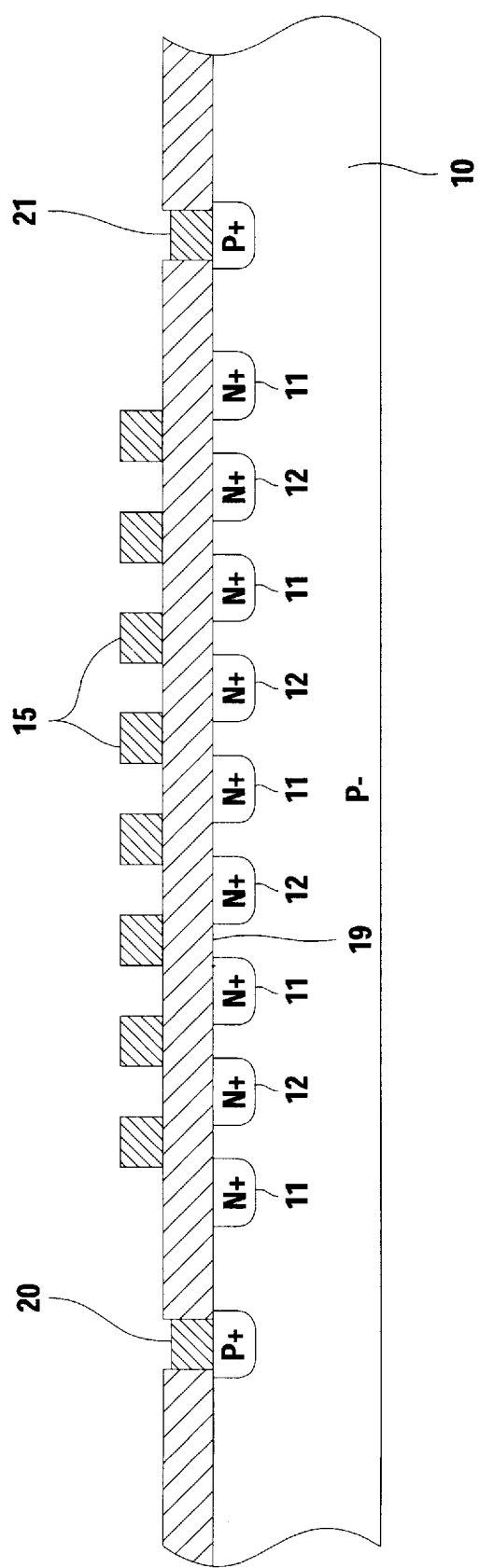
FIG. 3 is an elevation view in section of the semiconductor device of FIG. 1, the section being taken along the line 3—3 in FIG. 1.

Referring to FIGS. 1, 2, and 3, semiconductor device is shown in plan and section views to illustrate features of the invention. A silicon chip 10 has a test transistor formed therein by N+ source and drain regions 11 and 12, creating a thick-oxide MOS transistor. Metal contacts 13 and 14 provide source and drain connections for testing. The substrate is predominately P− type in this illustrative embodiment. A gate is created by an elongated serpentine metal strip 15 extending between source and drain, with metal pads 16 and 17 at the ends of the strip for applying voltages and currents thereto during the test. Thick field oxide 18 separates the gate 15 from a channel 19 between source 11 and drain 12. The field oxide 18 is many times thicker than gate oxide used for the logic or memory transistors on the chip, and is the same oxide used in peripheral areas of the chip to isolate functional devices from one another. Contact to the substrate region of the chip 10 is made at contact points 20 and 21, spaced from the test structure. Typically, the transistor device of FIGS. 1, 2 and 3 is a small test structure on a chip containing a memory such as an EEPROM, although the concepts of the invention are applicable to a semiconductor device of any type, such as memory, logic, microprocessor, etc. Usually there would be millions of MOS transistors in a chip forming the operable functions of the salable device, and only one or a few of the test transistors as shown would be used, perhaps one per chip or die, or one per wafer containing hundreds of die or chips.

The test procedure is a sequence of steps involving measuring the threshold voltage of the thick-oxide transistor of FIGS. 1, 2, and 3, following by heating the transistor using the metal gate strip 15 to a precise temperature while applying a stress voltage to the source, drain and substrate at contacts 16, 17, 20, and 21, then measuring the threshold voltage again. The sequence is as follows:

1. The threshold voltage is measured by applying operating voltage between source 11 and drain 12 at contacts 13 and 14, then applying an increasing voltage to the gate 15, and detecting the gate voltage at which the device turns on. This voltage will be much larger than standard logic voltages, because this is a thick-oxide transistor rather than a thin-oxide MOS transistor as is used for all of the normal operating devices on the chip.

2. One end of the metal gate line 15 is connected to ground (at either contact 16 or contact 17) and a negative stress voltage is applied to the substrate. This voltage is much larger than the operating logic voltage for thin-oxide transistors on the chip, but is less than the thick-oxide breakdown voltage for the device. This stress voltage accelerates the migration of ionic contaminates in the oxide 18 toward the silicon oxide to silicon interface at the upper edge of the channel 19 so that a test may be done in minutes whereas (in combination with heating) the same amount of migration might take many months or even years in ordinary operating conditions.

3. Current is forced at the other end of the metal line 15. The voltage is measured between the two inner taps 16 and 17 on the metal line 15. The ratio of voltage to current gives the resistance. With a known initial temperature (e.g., room temperature) and resistance measured at low current, and a known temperature coefficient of resistance, the temperature of the metal line 15 can be calculated for any forced current. The value of the current is selected to provide the desired temperature.

4. The current through the metal line 15 is increased until the stress temperature is reached. The current through the metal line 15 and the voltage applied to the P– substrate via contacts 20, 21 are held constant for a selected stress time.

5. The current through the metal line 15 is reduced. When the temperature has reached approximately the initial temperature, the bias on the P– substrate is removed.

6. The threshold voltage of the thick-oxide transistor is again measured as in step 1. Any reduction in threshold voltage can be attributed to the migration of positive charge to the silicon-to-oxide interface, and is proportional to the area mobile ionic charge concentration between the N+ active regions 11 and 12 and under the metal line 15.

Although not shown in FIGS. 1, 2, and 3, the chip or wafer containing the test structure thus far described would also have one or more levels of polysilicon for forming gates of logic transistors and for forming various interconnections. These gates are over thin-oxide areas in the usual manner.

While the invention has been shown and described with reference to a particular embodiment, it will be understood that various changes in form and detail of the preferred embodiment, as well as other embodiments of the invention, may be made by those skilled in the art without departing from the true spirit and scope of the invention.

What is claimed is:

1. A test structure in a semiconductor substrate, the test structure for measuring a level of mobile ionic contamination, the test structure comprising:

a substrate contact pad for making electrical contact with the semiconductor substrate, a source region formed in the semiconductor substrate, the source region having source region fingers, a source region contact pad for making electrical contact to the source region, a drain region formed in the semiconductor substrate, the drain region having drain region fingers, with the drain region fingers of the drain region interdigitated with the source region fingers of the source region, a drain region contact pad for making electrical contact to the drain region, the source region contact pad and the drain region contact pad adapted for selectively applying a first voltage between the source region and the drain region, a channel region formed in the semiconductor substrate, the channel region disposed in a serpentine configuration between the interdigitated source region fingers and the drain region fingers, an insulation layer formed over the channel region between the source region and the drain region, a gate electrode formed over the insulation layer, the gate electrode having a length sufficient to permit accurate resistance measurements of the gate electrode so as to determine a temperature of the gate electrode, the gate electrode having a serpentine shape so as to fit the length of the gate electrode within a compact area of the semiconductor substrate, and the gate electrode formed of a metal so as to heat across the entire length and width of the gate electrode when a current is applied through the gate electrode, a first gate contact pad disposed at a first end of the gate electrode, and a second gate contact pad disposed at a second end of the gate electrode, at least one of the first gate contact pad and the second gate contact pad for selectively applying an increasing second voltage to the gate electrode and for measuring a threshold voltage when current starts to flow between the source region and the drain region, the first gate contact pad and the second gate contact pad for selectively applying the current through the gate electrode and thereby heating the gate electrode, the insulation layer, and the channel region with a joule effect, with a thermal gradient between the gate electrode, the insulation layer, and the channel region, thereby drawing mobile ion contamination toward an interface between the channel region and the insulation layer, the substrate contact pad for selectively applying a third voltage to the semiconductor substrate, where the thermal gradient and the third voltage reduce the threshold voltage, and the reduction in threshold voltage is proportional to the level of mobile ion contamination.

2. An integrated circuit, the improvement comprising the test structure of claim 1.

3. A method of measuring a level of mobile ionic contamination with a test structure in a semiconductor substrate the test structure having a substrate contact pad, a source region having source region fingers, a drain region having drain region fingers, with the drain region fingers of the drain region interdigitated with the source region fingers of the source region, a channel region disposed in a serpentine configuration between the interdigitated source region fingers and the drain region fingers, an insulation layer formed over the channel region between the source region and the drain region, an elongated serpentine metal gate electrode formed over the insulation layer, a first gate contact pad disposed at a first end of the gate electrode, and a second gate contact pad disposed at a second end of the gate electrode, the method comprising the steps of:

- applying a first voltage between the source region and the drain region,
- applying an increasing second voltage to the gate electrode,
- detecting a first threshold voltage of the test structure at an initial temperature, where the first threshold voltage is the second voltage at which current begins to flow between the source region and the drain region,
- applying a ground potential to the gate electrode,
- applying a third voltage to the substrate contact pad, the drain region, and the source region, thereby drawing mobile ion contamination to an interface between the insulation layer and the channel region,
- heating the channel region, insulation layer, and gate electrode to a stress temperature by passing a current through the gate electrode, thereby drawing mobile ion contamination to the interface between the insulation layer and the channel region,
- removing the current passed through the gate electrode so that the test structure cools to the initial temperature,
- removing the third voltage applied to the substrate contact pad, the drain region, and the source region,
- applying an increasing fourth voltage to the gate electrode,
- detecting a second threshold voltage of the test structure at the initial temperature, where the second threshold voltage is the fourth voltage at which current begins to flow between the source region and the drain region, and the second threshold voltage is less than the first threshold voltage due to the mobile ion contamination at the interface between the insulation layer and the channel region, and
- determining the level of mobile ion contamination by comparing the first threshold voltage to the second threshold voltage.

4. The method of claim 3 where the test structure is an NMOS device, the third voltage is a negative voltage, and the mobile ion contamination is positive mobile ion contamination.

* * * * *